United States Patent
Horning

(10) Patent No.: US 11,812,576 B2
(45) Date of Patent: Nov. 7, 2023

(54) SOCKET CONNECTOR FOR A POWER CONNECTOR SYSTEM

(71) Applicant: TE Connectivity Services GmbH, Schaffhausen (CH)

(72) Inventor: Michael James Horning, Landisville, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 10 days.

(21) Appl. No.: 17/335,627

(22) Filed: Jun. 1, 2021

(65) Prior Publication Data

US 2022/0071040 A1 Mar. 3, 2022

Related U.S. Application Data

(60) Provisional application No. 63/069,912, filed on Aug. 25, 2020.

(51) Int. Cl.
*H05K 7/10* (2006.01)
*H05K 5/03* (2006.01)
*H05K 5/02* (2006.01)

(52) U.S. Cl.
CPC ............. *H05K 7/10* (2013.01); *H05K 5/0221* (2013.01); *H05K 5/0295* (2013.01); *H05K 5/03* (2013.01)

(58) Field of Classification Search
CPC ....................................................... G06F 1/181
See application file for complete search history.

(56) References Cited

U.S. PATENT DOCUMENTS

| | | |
|---|---|---|
| 9,059,542 B2 | 6/2015 | Oh et al. |
| 9,077,114 B2 | 7/2015 | Oh et al. |
| 9,190,784 B1 | 11/2015 | Oh et al. |
| 9,225,116 B2 | 12/2015 | McKibben |
| 10,122,117 B2 | 11/2018 | Miller et al. |
| 2016/0308304 A1* | 10/2016 | Miller ............... H01R 13/6271 |

* cited by examiner

*Primary Examiner* — Jerry Wu

(57) ABSTRACT

A socket connector includes a housing having a top, a bottom, a first side wall and a second side wall forming cavities that receive power sockets. The housing includes pin access openings through the bottom that receive power pins mated to the power sockets. Each power socket includes a cable socket receiving a power cable and a pin socket that receives the power pin. The power socket electrically connects the power cable and the power pin. The socket connector includes latches each having a latch release and a latch arm operably coupled to the latch release. The latch arm extends along the corresponding pin access opening and includes a latching surface aligned with the pin access opening configured to engage the power pin to retain the power pin in the housing. The release button is actuated to release the latch arm from the power pin and allow removal of the power pin from the housing.

21 Claims, 4 Drawing Sheets

SOCKET CONNECTOR FOR A POWER CONNECTOR SYSTEM

CROSS REFERENCE TO RELATED APPLICATIONS

This application claims benefit to U.S. Provisional Application No. 63/069,912, filed 25 Aug. 2020, titled "SOCKET CONNECTOR FOR A POWER CONNECTOR SYSTEM", the subject matter of which is herein incorporated by reference in its entirety.

BACKGROUND OF THE INVENTION

The subject matter herein relates generally to a power connector system.

A power connector system includes power connectors to provide electrical power to various system components. For example, the power connector system may be a used in a backplane power distribution application. Some known conventional power connector system includes a cable mounted power socket electrically connected to a power pin. The power pin may be mounted to a circuit board or a bus bar to supply power to the circuit board or bus bar. The power pin is a single-pole, quick connect and disconnect replacement for lug connections. The power pin is reliable and offers better serviceability than bolt-fitted lugs. Known power connector systems are not without disadvantages. For example, the power pin may have a current carrying limit. Additionally, unmating of the power pin from the power socket may be problematic.

A need remains for a cost effective and reliable socket connector for a power connector system.

BRIEF DESCRIPTION OF THE INVENTION

In one embodiment, a socket connector is provided. The socket connector includes a housing having a top, a bottom, a first side wall and a second side wall. The housing has a front and a rear. The housing includes a cavity. The housing includes a pin access opening through the bottom. The socket connector includes a power socket received in the cavity. The power socket has a cable socket configured to receive a power cable and the power socket configured to be coupled to the power cable. The power socket has a pin socket configured to receive a power pin. The pin socket is aligned with the pin access opening of the housing. The power socket electrically connects the power cable and the power pin. The socket connector includes a latch associated with the housing. The latch includes a latch release and a latch arm operably coupled to the latch release. The latch release moves the latch arm. The latch arm extends along the pin access opening. The latch arm includes a latching surface aligned with the pin access opening to retain the power pin in the housing. The release button is actuated to release the latch arm from the power pin and allow removal of the power pin from the housing.

In another embodiment, a socket connector is provided. The socket connector includes a housing having a top, a bottom, a first side wall and a second side wall. The housing has a front and a rear. The housing includes a first cavity and a second cavity with a separating wall therebetween. The housing includes a first pin access opening through the bottom open to the first cavity and a second pin access opening through the bottom open to the second cavity. The socket connector includes a first power socket received in the first cavity. The first power socket has a first cable socket configured to receive a first power cable and the first power socket configured to be coupled to the first power cable. The first power socket has a first pin socket configured to receive a first power pin. The first pin socket is aligned with the first pin access opening of the housing. The first power socket electrically connects the first power cable and the first power pin. The socket connector includes a second power socket received in the second cavity. The second power socket has a second cable socket configured to receive a second power cable and the second power socket configured to be coupled to the second power cable. The second power socket has a second pin socket configured to receive a second power pin. The second pin socket is aligned with the second pin access opening of the housing. The second power socket electrically connects the second power cable and the second power pin. The socket connector includes a first latch associated with the housing. The first latch includes a first latch release and a first latch arm operably coupled to the first latch release. The first latch release moves the first latch arm. The first latch arm extends along the first pin access opening. The first latch arm includes a first latching surface aligned with the first pin access opening to retain the first power pin in the housing. The first release button is actuated to release the first latch arm from the first power pin and allow removal of the first power pin from the housing. The socket connector includes a second latch associated with the housing. The second latch includes a second latch release and a second latch arm operably coupled to the second latch release. The second latch release moves the second latch arm. The second latch arm extends along the second pin access opening. The second latch arm includes a second latching surface aligned with the second pin access opening to retain the second power pin in the housing. The second release button is actuated to release the second latch arm from the second power pin and allow removal of the second power pin from the housing.

In a further embodiment, a power connector system is provided. The power connector system includes a pin connector having a substrate holding a first power pin and a second power pin. The first power pin includes a first step. The second power pin includes a second step. The power connector system includes a socket connector coupled to the pin connector. The socket connector includes a housing having a top, a bottom, a first side wall and a second side wall. The housing has a front and a rear. The housing includes a first cavity and a second cavity with a separating wall therebetween. The housing includes a first pin access opening through the bottom open to the first cavity and a second pin access opening through the bottom open to the second cavity. The socket connector includes a first power socket received in the first cavity. The first power socket has a first cable socket configured to receive a first power cable and the first power socket configured to be coupled to the first power cable. The first power socket has a first pin socket receiving the first power pin. The first pin socket is aligned with the first pin access opening of the housing. The first power socket electrically connects the first power cable and the first power pin. The socket connector includes a second power socket received in the second cavity. The second power socket has a second cable socket configured to receive a second power cable and the second power socket configured to be coupled to the second power cable. The second power socket has a second pin socket receiving the second power pin. The second pin socket is aligned with the second pin access opening of the housing. The second power socket electrically connects the second power cable and the second power pin. The socket connector includes a first latch associated with the housing. The first latch includes a first latch release and a first latch arm operably coupled to the first latch release. The first latch release moves the first latch arm. The first latch arm extends along the first pin access opening. The first latch arm includes a first latching surface aligned with the first pin access opening. The first latching surface engages the first step to retain the first power pin in the housing. The first release button is actuated to release the first latch arm from the first power pin and allow removal of the first power pin from the housing. The socket connector includes a second latch associated with the housing. The second latch includes a second latch release and a second latch arm operably coupled to the second latch release. The second latch release moves the second latch arm. The second latch arm extends along the second pin access opening. The second latch arm includes a second latching surface aligned with the second pin access opening. The second latching surface engages the second step to retain the second power pin in the housing. The second release button is actuated to release the second latch arm from the second power pin and allow removal of the second power pin from the housing.

DETAILED DESCRIPTION OF THE INVENTION

Figure 1:
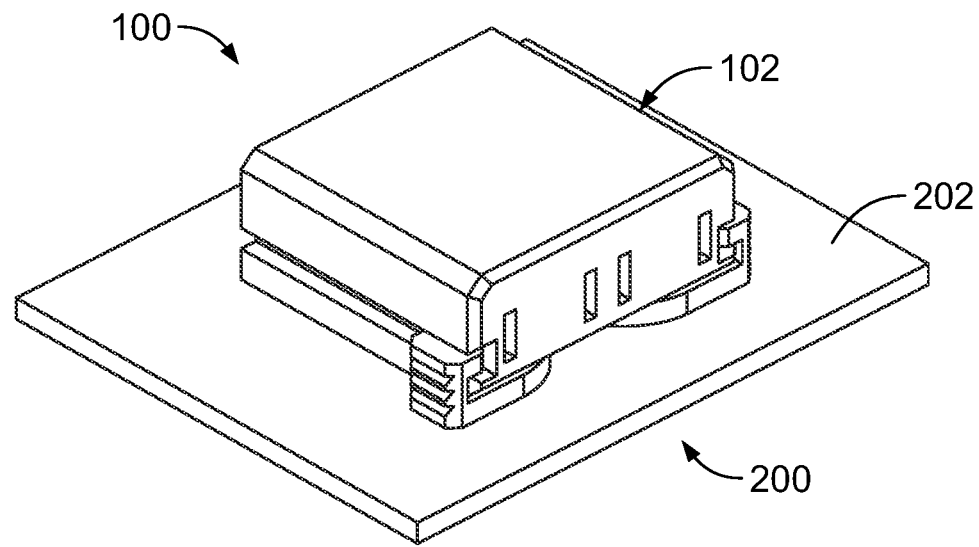
FIG. 1 illustrates a power connector system having a socket connector in accordance with an exemplary embodiment.
Figure 2:
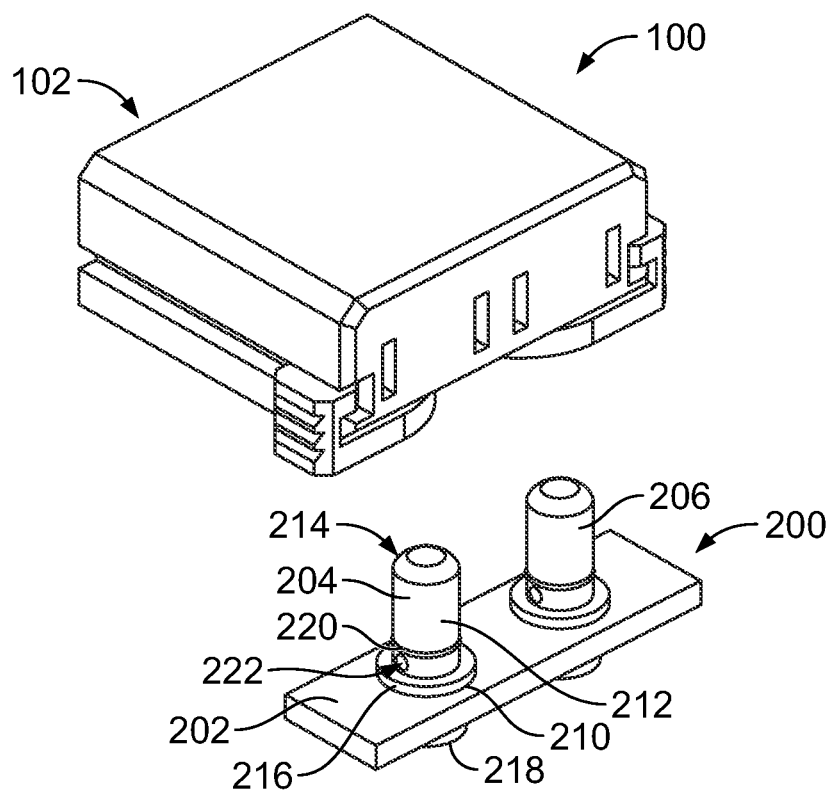
FIG. 2 is an exploded view of the power connector system in accordance with an exemplary embodiment.

FIG. 1 illustrates a power connector system 100 in accordance with an exemplary embodiment. FIG. 2 is an exploded view of the power connector system 100 in accordance with an exemplary embodiment. The power connector system 100 includes a socket connector 102 and a pin connector 200. The socket connector 102 is configured to be removably coupled to the pin connector 200. In an exemplary embodiment, the socket connector 102 includes multiple conductors and the pin connector 200 includes multiple conductors. The plurality of conductors may be simultaneously mated and simultaneously unmated.

The pin connector 200 includes a substrate 202 holding a first power pin 204 and a second power pin 206. Providing multiple power pins 204, 206 increases current carrying capacity of the power connector system 100. In an exemplary embodiment, the first power pin 204 is a positive power pin and the second power pin 206 is a negative power pin forming a power circuit. In other various embodiments, the first and second power pins 204, 206 may both be positive power pins or both be negative power pins to increase current carrying capacity of the pin connector 200. In such embodiments, a second pin connector may be provided providing the other of the positive or negative power pins. In various embodiments, the substrate 202 is a circuit board. The power pins 204, 206 may be coupled to the circuit board by a press-fit connection or by using screws. In other various embodiments, the substrate 202 is a busbar. The power pins 204, 206 may be coupled to the busbar using screws or swaging the power pins 204, 206. Optionally, multiple substrates 202 may be provided with each substrate holding a respective power pin 204, 206.

In an exemplary embodiment, the first and second power pins 204, 206 are identical. Each power pin includes a base 210 mounted to the substrate 202 and the pin 212 extending from the base 210. The pin 212 extends to a mating end 214. In various embodiments, the pin 212 is generally cylindrical. In an exemplary embodiment, the base 210 includes a flange 216 coupled to the substrate 202. The flange 216 is seated on an upper surface of the substrate 202. The flange 216 may be electrically connected to the substrate 202. In an exemplary embodiment, the base 210 extends through an opening in the substrate 202. The base 210 may be press-fit into the opening of the substrate 202. Optionally, a fastener 218, such as a screw, is coupled to the bottom end of the base 210 below the substrate 202.

In an exemplary embodiment, the pin 212 includes a lip 220 extending around the circumference of the pin 212. The pin 212 is stepped inward below the lip 220. For example, the lip 220 includes a step 222 along the bottom surface of the lip 220. The step 222 is downward facing. The step 222 forms a surface for latchably coupling the socket connector 102 to the pin 212. Optionally, a diameter of the pin 212 may be reduced below the lip 220, such as between the step 222 and the flange 216. In various embodiments, the pin 212 may be machined, such as being screw machined, to form the lip 220 and the step 222.

Figure 3:
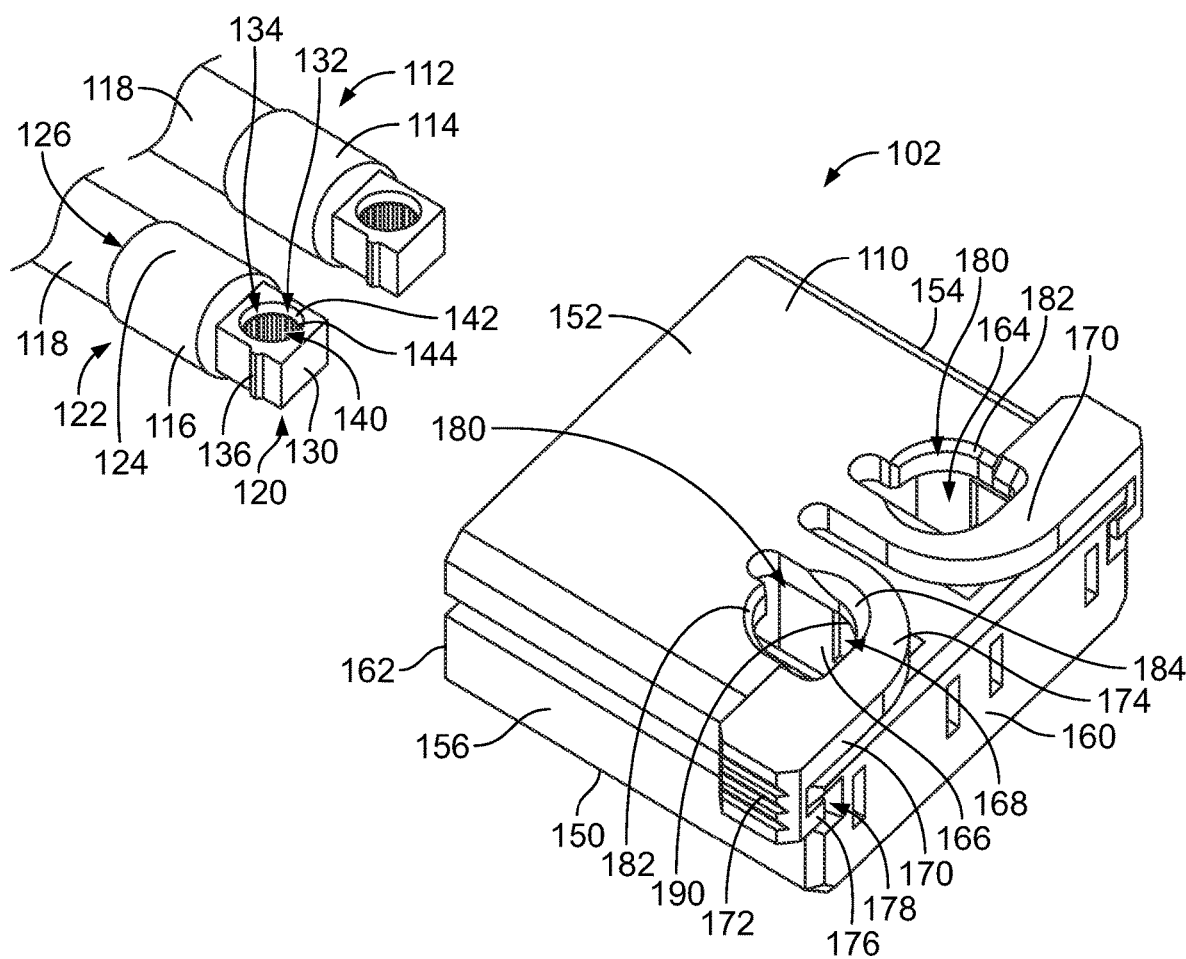
FIG. 3 is an exploded, bottom perspective view of the socket connector in accordance with an exemplary embodiment.

FIG. 3 is an exploded, bottom perspective view of the socket connector 102 in accordance with an exemplary embodiment. The socket connector 102 includes a housing 110 holding one or more power sockets 112. In the illustrated embodiment, the socket connector 102 includes a pair of the power sockets 112, which includes a first power socket 114 and a second power socket 116. Optionally, the first and second power sockets 114, 116 may be identical. Each power socket 112 is electrically connected to a power cable 118. The first and second power sockets 114, 116 are configured to be electrically connected to the first and second power pins 204, 206 (shown in FIG. 2), respectively.

The power socket 112 is manufactured from a conductive material, such as a copper or aluminum material. In various embodiments, the power socket 112 is a machined part. In alternative embodiments, the power socket 112 may be diecast, extruded, molded or may be a stamped and formed part. The power socket 112 extends between a mating end 120 and a terminating end 122. The terminating end 122 is coupled to the power cable 118. In an exemplary embodiment, the power socket 112 includes a crimp barrel 124 at the terminating end 122. The crimp barrel 124 is hollow forming a cable socket 126 that receives the power cable 118. The crimp barrel 124 is crimped to the power cable 118, such as using a crimping tool. The terminating end 122 may be coupled to the power cable 118 by other means in alternative embodiments. For example, the terminating end 122 may include a weld pad welded to the end of the power cable 118.

The power socket 112 includes a main body 130 at the mating end 120. The main body 130 includes a pin socket 132 configured to receive the corresponding pin 212 (shown in FIG. 2). The main body 130 includes an opening 134 at a top thereof that is open to the pin socket 132. The bottom of the main body 130 may additionally or alternatively include the opening 134. The bottom of the main body 130 may be closed in other various embodiments. In the illustrated embodiment, the pin socket 132 extends along an axis that is perpendicular to the power cable 118. However, other orientations are possible in alternative embodiments. For example, the pin socket 132 may extend along an axis that is parallel to the power cable 118. In an exemplary embodiment, the main body 130 includes retention features 136 used to retain the power socket 112 in the housing 110. For example, the retention features 136 may be barbs or ribs formed along sides of the main body 130. Other types of retention features may be used in alternative embodiments.

In an exemplary embodiment, the power socket 112 includes a torsional band contact 140 received in the pin socket 132. The torsional band contact 140 includes rings or bands 142 around the top and a bottom of the torsional band contact 140 and spring beams 144 extending between the bands 142. The spring beams 144 are deflectable relative to each other the spring beams 144 extend inward toward an interior of the torsional band contact 140. For example, the torsional band contact 140 may have an hourglass shape. The spring beams 144 include separable mating interfaces configured to engage and electrically connect to the pin 212 with the pin 212 is plugged into the pin socket 132 in the torsional band contact 140.

The housing 110 receives the power sockets 112 and allows mating and unmating of the power sockets 112 simultaneously with the pin connector 200. The housing 110 is manufactured from a dielectric material, such as a plastic material. The housing 110 may be molded, such as being injection molded. The housing 110 includes a top 150, a bottom 152, a first side wall 154, and a second side wall 156. The housing 110 extends between a front 160 and a rear 162. The housing 110 includes one or more cavities 164 that receive the power sockets 112. In various embodiments, the housing 110 may include a pair of cavities, such as a first cavity and a second cavity that receive the first power socket 114 and the second power socket 116, respectively. The cavities 164 may be separated by the separating wall 166, which electrically isolates the first power socket 114 from the second power socket 116. The housing 110 includes retaining features 168 that retain the power socket 112 in the cavities 164. For example, the retaining features 168 may include latches, tabs, recesses, shoulders, and the like formed in the walls defining the cavities 164. When the power sockets 112 are received in the cavities 164, the housing 110 may completely enclosed the power sockets 112 for mating a touch safe covering for the power sockets 112. For example, tabs, bottoms, sides, fronts and/or rears of the power sockets 112 may be covered by the housing 110. The power cables 118 may extend from the rear 162 of the housing 110. However, the cable jacket of the power cables 118 may extend into the cavities 164 such that the conductive portions of the power cables 118 are not exposed exterior of the housing 110. The power sockets 112 do not require secondary insulative coverings to make the power sockets 112 touch safe. Rather, the housing 110 includes as the conductive portions of the power sockets 112 without the need for secondary split of coverings.

In an exemplary embodiment, the socket connector 102 includes one or more latches 170 used to couple the socket connector 102 to the pin connector 200. In an exemplary embodiment, the latches 170 are configured to directly engage the power pins 204, 206 (shown in FIG. 2). In an exemplary embodiment, the latches 170 are integral with the housing 110. For example, the latches 170 may be molded with the housing 110. Alternatively, the latches 170 may be separate from the housing 110 and coupled to the housing 110.

The latches 170 are deflectable to release the socket connector 102 from the pin connector 200. In an exemplary embodiment, each latch 170 includes a latch release 172 and a latch arm 174 operably coupled to the latch release 172. The latch arm 174 is moved from a blocking position to a clearance position when the latch release 172 is actuated (for example, when the latch release 172 is pressed by an operator). The latch arm 174 returns from the clearance position to the blocking position when the latch release 172 is released by the operator. In an exemplary embodiment, the latch release 172 includes a locating tab 176 received in a locating slot 178 of the housing 110. The locating slot 178 guides movement of the latch release 172 between a released position and an actuated position. The locating tab 176 prevents inadvertent releasing of the latch release 172 by maintaining a relative position of the distal end of the latch 170 relative to the housing 110.

In an exemplary embodiment, the housing 110 includes pin access openings at the bottom 152. The pin access openings 180 provide access to the cavities 164. In an exemplary embodiment, the power sockets 112 are arranged in the housing 110 such that the pin sockets 132 are aligned with the pin access openings 180 to receive the power pins 204, 206. In an exemplary embodiment, the housing 110 includes guide surfaces at the pin access openings 180 to guide loading of the power pins 204, 206 into the pin access openings 180. For example, the guide surfaces 182 are angled or chamfered surfaces used to funnel the power pins 204, 206 into the pin access openings 180. The guide surfaces 182 provide a larger catch radius for receiving the power pins 204, 206 to guide mating of the socket connector 102 with the pin connector 200.

In an exemplary embodiment, the latches 170 are provided at the pin access openings 180. For example, the latch arms 174 may extend along portions of the pin access openings 180. In the illustrated embodiment, the latch arms 174 define approximately 180° of the pin access openings 180. The latch arms 174 include guide surfaces 184 to guide loading of the power pins 204, 206 into the pin access openings 180. The latches 170 include latching surfaces 190 configured to engage the power pins 204, 206 to latchably secure the socket connector 102 to the pin connector 200. The latching surfaces 190 may be provided along portions of the latch arms 174.

Figure 4:
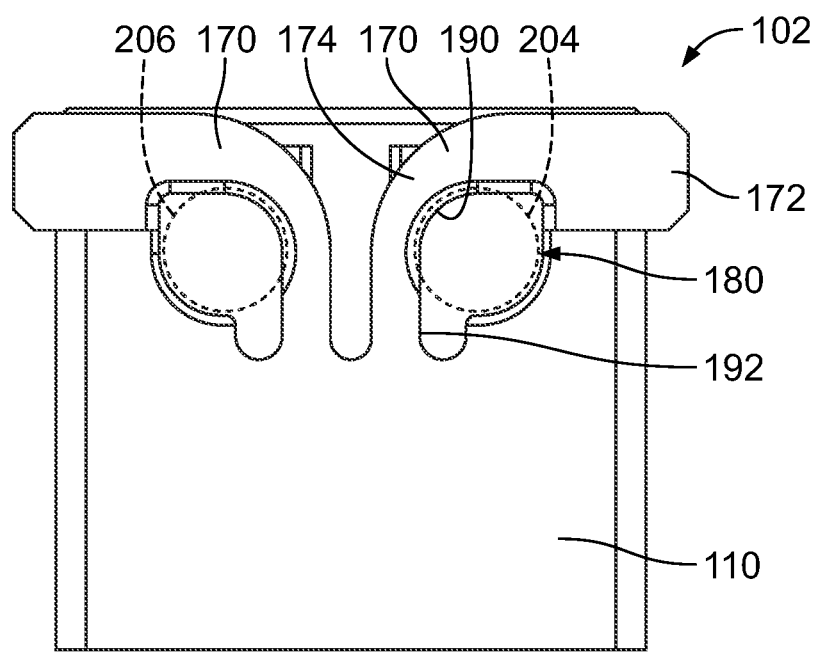
FIG. 4 is a bottom view of a portion of the socket connector showing latches in blocking positions in accordance with an exemplary embodiment.
Figure 5:
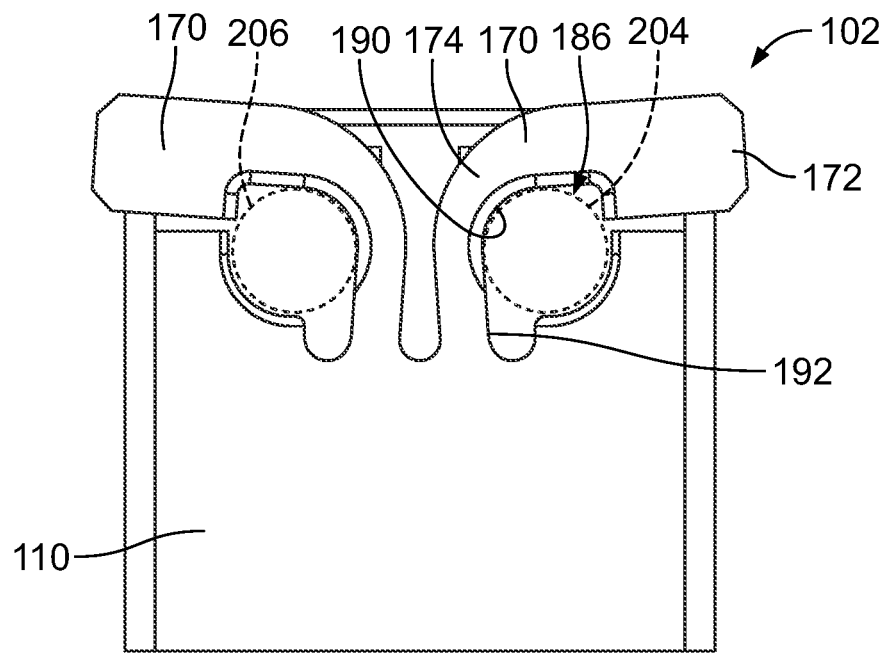
FIG. 5 is a bottom view of a portion of the socket connector showing the latches in clearance positions in accordance with an exemplary embodiment.

FIG. 4 is a bottom view of a portion of the socket connector 102 showing the latches 170 in blocking positions. FIG. 5 is a bottom view of a portion of the socket connector 102 showing the latches 170 in clearance positions. In the blocking positions (FIG. 4), the latching surfaces 190 of the latches 170 are configured to engage and secure the latches 170 to the power pins 204, 206 (shown in phantom). For example, the latching surfaces 190 may engage the lip 220 and/or the step 222 (shown in FIG. 2) to prevent pull off or separation of the socket connector 102 from the pin connector 200 (shown in FIG. 2). The latching surfaces 190 are upward facing to interface with the downward facing steps 222 of the power pins 204, 206. The latches 170 are thus used to couple the socket connector 102 to the pin connector 200. The latches 170 are releasable to uncouple the socket connector 102 from the pin connector 200.

In an exemplary embodiment, the latch arms 174 are curved to at least partially surround the pin access opening 180 and the power pins 204, 206. Optionally, the latch arms may have a radius of curvature that is similar to a radius of curvature of the power pins 204, 206. In an exemplary embodiment, the latch arms 174 extend only partially around the power pins 204, 206. For example, the latch arms 174 may extend around approximately half of the power pins 204, 206. The housing 110 surrounds the other portion (for example, approximately half) of the power pins 204, 206. The latching surfaces 190 interface with only a portion of the circumference of the power pins 204, 206. For example, the latching surfaces 190 may interface with only one side of each power pin 204, 206. In the illustrated embodiment, the latching surfaces 190 are configured to interface with a single quadrant of the power pins 204, 206. For example, the latching surfaces 190 engage approximately 90° of the circumference of each of the power pins 204, 206 in the illustrated embodiment. The latching surfaces 190 may engage a longer or shorter length of the circumference in alternative embodiments.

During release, the latch releases 172 are actuated to move the latches 170 from the blocking positions (FIG. 4) to the clearance position (FIG. 5). For example, the latch releases 172 may be pressed inward relative to the housing 110 to release the latches 170. The latch releases 172 are easily accessible from the exterior of the housing 110 to allow quick and easy unlatching of the socket connector 102 from the pin connector 200. The latch arms 174 are pivoted or rotated about fixed ends 192 of the latch arms 174 when the latch releases 172 are actuated. The pivoting movement of the latches 170 opens the pin access openings 180 a greater amount, releasing the latches 170 from connection with the power pins 204, 206. In the clearance positions, gaps 186 are provided between the latch arms 174 and the power pins 204, 206. Thus, the socket connector 102 may be removed from the power pins 204, 206 without obstruction.

Figure 6:
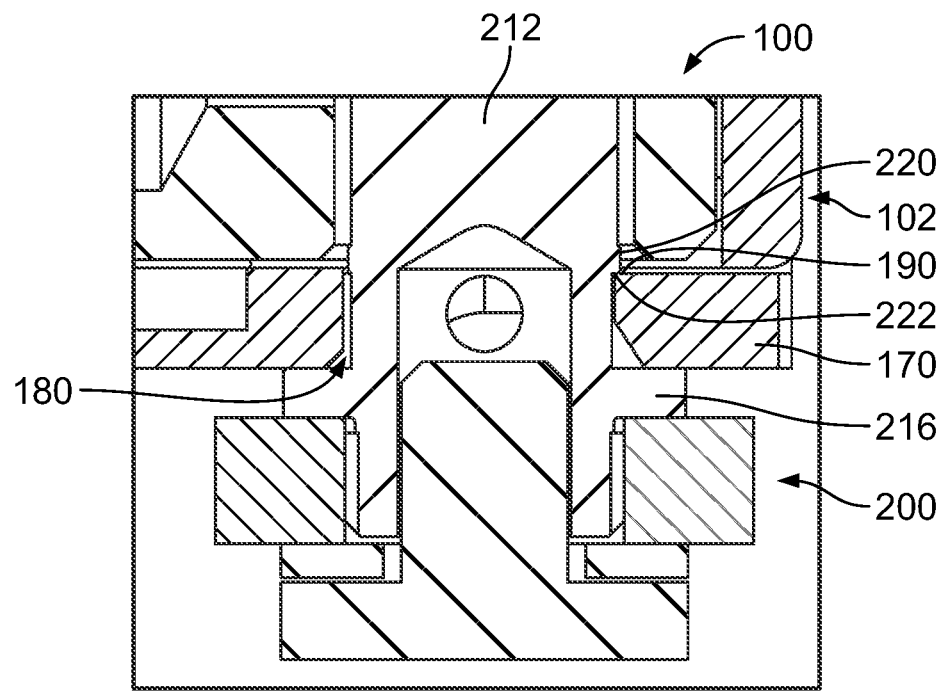
FIG. 6 is a cross-sectional view of a portion of the power connector system showing the socket connector latchably coupled to the pin connector in accordance with an exemplary embodiment.
Figure 7:
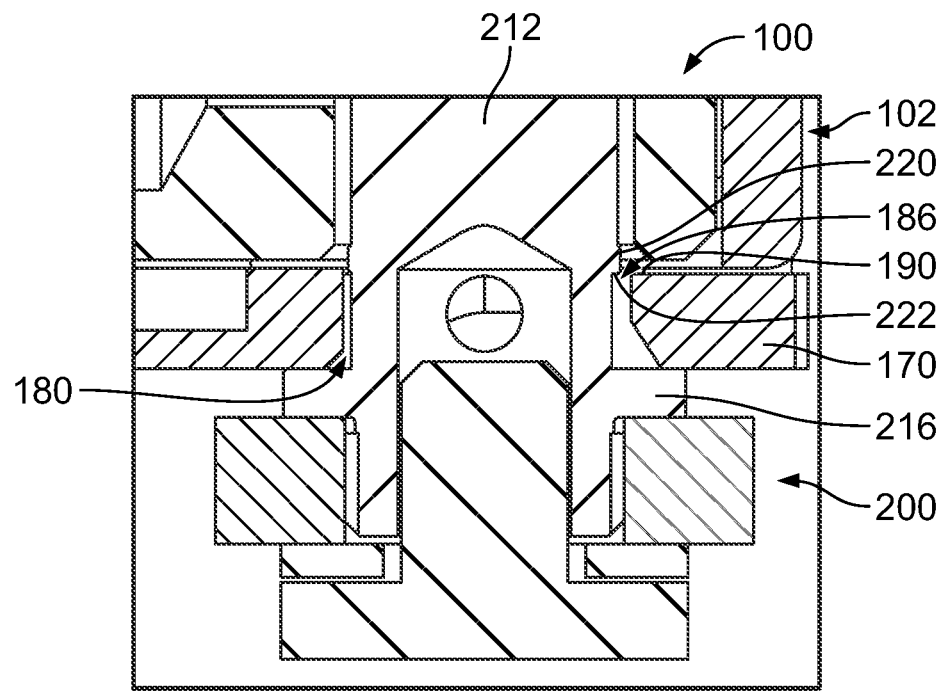
FIG. 7 is a cross-sectional view of a portion of the power connector system showing the socket connector unlatched from the pin connector in accordance with an exemplary embodiment.

FIG. 6 is a cross-sectional view of a portion of the power connector system 100 showing the socket connector 102 latchably coupled to the pin connector 200. FIG. 7 is a cross-sectional view of a portion of the power connector system 100 showing the socket connector 102 unlatched from the pin connector 200. In the latched position (FIG. 6), the latch 170 is captured between the lip 220 and the flange 216. The latching surface 190 of the latch 170 engages the pin 212 to secure the socket connector 102 to the pin connector 200. The latching surface 190 is located below the lip 220 and the step 222 prevents pull off or separation of the socket connector 102 from the pin connector 200 (for example, in an upward or separating direction). The latch 170 is thus used to couple the socket connector 102 to the pin connector 200.

In the unlatched position, the latch arm 174 is moved from a blocking position to a clearance position. The latch arm 174 is moved outward away from the pin 212 to provide clearance or space between the latching surface 190 and the pin 212. The movement opens the pin access opening 180 to allow separation of the socket connector 102 from the pin connector 200. The gap 186 is provided between the latch arm 174 and the pin 212. The latch arm 174 is no longer captured below the lip 220 under the step 222. When unlatched, the socket connector 102 may be removed from the pin connector 200.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket connector comprising: a housing having a top, a bottom, a first side wall and a second side wall, the housing having a front and a rear, the housing including a cavity, the housing including a pin access opening through the bottom; a power socket received in the cavity, the power socket having a cable socket configured to receive a power cable and the power socket configured to be coupled to the power cable, the power socket having a pin socket configured to receive a power pin, the pin socket being aligned with the pin access opening of the housing, the power socket electrically connecting the power cable and the power pin; and a latch associated with the housing, the latch including a latch release and a latch arm integral with the latch release, the latch release being extended from the housing through the latch arm, the latch release moving the latch arm, the latch arm extending along the pin access opening, the latch arm including a latching surface aligned with the pin access opening to retain the power pin in the housing, the latch release being actuated to release the latch arm from the power pin and allow removal of the power pin from the housing.

2. The socket connector of claim 1, wherein the power socket is a first power socket, the housing having a second cavity holding a second power socket.

3. The socket connector of claim 1, wherein the latching surface is upward facing to engage a lip of the power pin to retain the power pin in the housing.

4. The socket connector of claim 1, wherein the latch arm is configured be received between a lip and a flange of the power pin such that the latching surface engages a step under the lip to retain the power pin in the housing.

5. The socket connector of claim 1, wherein the latch arm extends only partially around the power pin to engage only a portion of the power pin.

6. The socket connector of claim 1, wherein the latch arm is configured to engage a single quadrant of the power pin.

7. The socket connector of claim 1, wherein the housing completely encloses the power socket forming a touch safe covering for the power socket.

8. The socket connector of claim 1, wherein the latch arm is curved, the latching surface having a radius of curvature similar to a radius of curvature of the power pin.

9. The socket connector of claim 1, wherein the latch arm is movable between a blocking position and a clearance position, the latching surface engaging the power pin when the latch arm is in the blocking position, the latching surface disengaged from the power pin when the latch arm is in the clearance position.

10. A socket connector comprising: a housing having a top, a bottom, a first side wall and a second side wall, the housing having a front and a rear, the housing including a first cavity and a second cavity with a separating wall therebetween, the housing including a first pin access opening through the bottom open to the first cavity and a second pin access opening through the bottom open to the second cavity; a first power socket received in the first cavity, the first power socket having a first cable socket configured to receive a first power cable and the first power socket configured to be coupled to the first power cable, the first power socket having a first pin socket configured to receive a first power pin, the first pin socket being aligned with the first pin access opening of the housing, the first power socket electrically connecting the first power cable and the first power pin; a second power socket received in the second cavity, the second power socket having a second cable socket configured to receive a second power cable and the second power socket configured to be coupled to the second power cable, the second power socket having a second pin socket configured to receive a second power pin, the second pin socket being aligned with the second pin access opening of the housing, the second power socket electrically connecting the second power cable and the second power pin; a first latch associated with the housing, the first latch including a first latch release and a first latch arm integral with the first latch release, the first latch release being extended from the housing through the first latch arm, the first latch release moving the first latch arm, the first latch arm extending along the first pin access opening, the first latch arm including a first latching surface aligned with the first pin access opening to retain the first power pin in the housing, the first latch release being actuated to release the first latch arm from the first power pin and allow removal of the first power pin from the housing; and a second latch associated with the housing, the second latch including a second latch release and a second latch arm integral with the second latch release, the second latch release being extended from the housing through the second latch arm, the second latch release moving the second latch arm, the second latch arm extending along the second pin access opening, the second latch arm including a second latching surface aligned with the second pin access opening to retain the second power pin in the housing, the second latch release being actuated to release the second latch arm from the second power pin and allow removal of the second power pin from the housing.

11. The socket connector of claim 10, wherein the first latch arm faces the first side wall and the second latch arm faces the second side wall.

12. The socket connector of claim 10, wherein the first latch arm is deflectable toward the second latch arm when the first latch release is actuated, and wherein the second latch arm is deflectable toward the first latch arm when the second latch release is actuated.

13. The socket connector of claim 10, wherein the first latching surface is upward facing to engage a first lip of the first power pin to retain the first power pin in the housing, and wherein the second latching surface is upward facing to engage a second lip of the second power pin to retain the second power pin in the housing.

14. The socket connector of claim 10, wherein the first latch arm is configured be received between a first lip and a first flange of the first power pin such that the first latching surface engages a step under the first lip to retain the first power pin in the housing, and wherein the second latch arm is configured be received between a second lip and a second flange of the second power pin such that the second latching surface engages a step under the second lip to retain the second power pin in the housing.

15. The socket connector of claim 10, wherein the first latch arm extends only partially around the first power pin to engage only a portion of the first power pin, and wherein the second latch arm extends only partially around the second power pin to engage only a portion of the second power pin.

16. The socket connector of claim 10, wherein the first latch arm is configured to engage a single quadrant of the first power pin, and wherein the second latch arm is configured to engage a single quadrant of the second power pin.

17. The socket connector of claim 10, wherein the housing completely encloses the first and second power sockets forming a touch safe covering for the first and second power sockets.

18. The socket connector of claim 10, wherein the first latch arm is curved, the first latching surface having a radius of curvature similar to a radius of curvature of the first power pin, and wherein the second latch arm is curved, the second latching surface having a radius of curvature similar to a radius of curvature of the second power pin.

19. The socket connector of claim 10, wherein the first latch arm is movable between a blocking position and a clearance position, the first latching surface engaging the first power pin when the first latch arm is in the blocking position, the first latching surface disengaged from the first power pin when the first latch arm is in the clearance position, and wherein the second latch arm is movable between a blocking position and a clearance position, the second latching surface engaging the second power pin when the second latch arm is in the blocking position, the second latching surface disengaged from the second power pin when the second latch arm is in the clearance position.

20. A power connector system comprising: a pin connector having a substrate holding a first power pin and a second power pin, the first power pin including a first step, the second power pin including a second step; and a socket connector coupled to the pin connector, the socket connector comprising: a housing having a top, a bottom, a first side wall and a second side wall, the housing having a front and a rear, the housing including a first cavity and a second cavity with a separating wall therebetween, the housing including a first pin access opening through the bottom open to the first cavity and a second pin access opening through the bottom open to the second cavity; a first power socket received in the first cavity, the first power socket having a first cable socket configured to receive a first power cable and the first power socket configured to be coupled to the first power cable, the first power socket having a first pin socket receiving the first power pin, the first pin socket being aligned with the first pin access opening of the housing, the first power socket electrically connecting the first power cable and the first power pin; a second power socket received in the second cavity, the second power socket having a second cable socket configured to receive a second power cable and the second power socket configured to be coupled to the second power cable, the second power socket having a second pin socket receiving the second power pin, the second pin socket being aligned with the second pin access opening of the housing, the second power socket electrically connecting the second power cable and the second power pin; a first latch associated with the housing, the first latch including a first latch release and a first latch arm integral with the first latch release, the first latch release being extended from the housing through the first latch arm, the first latch release moving the first latch arm, the first latch arm extending along the first pin access opening, the first latch arm including a first latching surface aligned with the first pin access opening, the first latching surface engaging the first step to retain the first power pin in the housing, the first latch release being actuated to release the first latch arm from the first power pin and allow removal of the first power pin from the housing; and a second latch associated with the housing, the second latch including a second latch release and a second latch arm integral with the second latch release, the second latch release being extended from the housing through the second latch arm, the second latch release moving the second latch arm, the second latch arm extending along the second pin access opening, the second latch arm including a second latching surface aligned with the second pin access opening, the second latching surface engaging the second step to retain the second power pin in the housing, the second latch release being actuated to release the second latch arm from the second power pin and allow removal of the second power pin from the housing.

21. The socket connector of claim 1, wherein the latch arm and the latch release are integral with the housing being co-molded with the housing.

* * * * *